United States Patent
Mikulchenko

(10) Patent No.: US 7,289,922 B1
(45) Date of Patent: Oct. 30, 2007

(54) JITTER DECOMPOSITION FOR HIGH SPEED SERIAL INTERFACES

(75) Inventor: Oleg Mikulchenko, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/634,649

(22) Filed: Dec. 6, 2006

(51) Int. Cl.
G01R 29/26 (2006.01)

(52) U.S. Cl. .......................................... 702/69; 702/77

(58) Field of Classification Search .................. 702/57, 702/66, 67, 69, 70, 75, 76, 77, 87, 180; 375/226
See application file for complete search history.

(56) References Cited

U.S. PATENT DOCUMENTS

| | | | |
|---|---|---|---|
| 6,799,144 B2 * | 9/2004 | Li et al. ...................... 702/180 |
| 6,832,172 B2 * | 12/2004 | Ward et al. ................... 702/69 |
| 7,203,610 B2 * | 4/2007 | Tabatabaei et al. ........... 702/69 |
| 2002/0075951 A1 * | 6/2002 | Pearson ....................... 375/226 |
| 2003/0115017 A1 * | 6/2003 | Sun et al. .................... 702/181 |
| 2005/0080574 A1 * | 4/2005 | Draving ........................ 702/69 |
| 2005/0111536 A1 * | 5/2005 | Cranford et al. ............ 375/226 |
| 2005/0152488 A1 * | 7/2005 | Buckwalter et al. ........ 375/350 |
| 2005/0163204 A1 * | 7/2005 | Brewer ........................ 375/224 |
| 2005/0286627 A1 * | 12/2005 | Tabatabaei ................... 375/238 |
| 2006/0045175 A1 * | 3/2006 | Draving et al. ............. 375/224 |
| 2006/0093027 A1 * | 5/2006 | Draving et al. ............. 375/226 |
| 2006/0161361 A1 * | 7/2006 | Tabatabaei ................... 702/69 |
| 2006/0251200 A1 * | 11/2006 | Miller ........................ 375/371 |

* cited by examiner

*Primary Examiner*—Jeffrey R. West

(57) ABSTRACT

An apparatus and method to decompose measured phase jitter into a deterministic component and a random component. After filtering a time-domain measured phase jitter signal, a discrete Fourier transform is applied, followed by squaring. A density function is formed from the square of the discrete Fourier transform, from which a noise floor is estimated. The frequency-domain phase jitter is processed by zeroing out those frequency components having a magnitude equal to or less than the noise floor, and the remaining frequency components are processed by subtracting out a pseudo-random sequence having a magnitude equal to the noise floor and having a uniformly distributed phase. This processing provides an estimate of the deterministic component in the frequency domain, and an inverse discrete Fourier transform may be applied to transform into the time domain to yield an estimate of the deterministic component of the phase jitter in the time domain.

14 Claims, 2 Drawing Sheets

JITTER DECOMPOSITION FOR HIGH SPEED SERIAL INTERFACES

FIELD

Embodiments of the present invention relate to serial data communications, and more particularly, to the characterization of jitter in a serial data communication system.

BACKGROUND

In various data and computer systems, data may be exchanged between modules by way of a serial data interface. This is illustrated at a high level in FIG. 1, where modules 104 and 106 exchange data over transmission lines 102. Modules 104 and 106 include transmit and receive functional units 108 and 110, respectively. Module 104 or module 106 may be, for example, a discrete chip (die), a board, or a higher level component in a system. For purposes of testing a serial interface, module 104, module 106, or both, may be special-purpose test equipment, such as, for example, a serial bus analyzer, sometimes referred to as a real-time scope.

Jitter may be defined as the short-term variation of a signal with respect to its ideal position in time. For some current specifications of high speed serial data interfaces, it is useful to characterize the jitter present in a data signal by decomposing the total jitter into a deterministic component and a random component. For example, the bit error rate (BER) is usually difficult to measure directly because it is a very small number, for example, on the order of $e^{-12}$. However, the BER of a data communication system may be estimated based upon the deterministic and random components of total jitter. It is therefore useful to provide a method for decomposing measured total jitter into its deterministic and random components.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
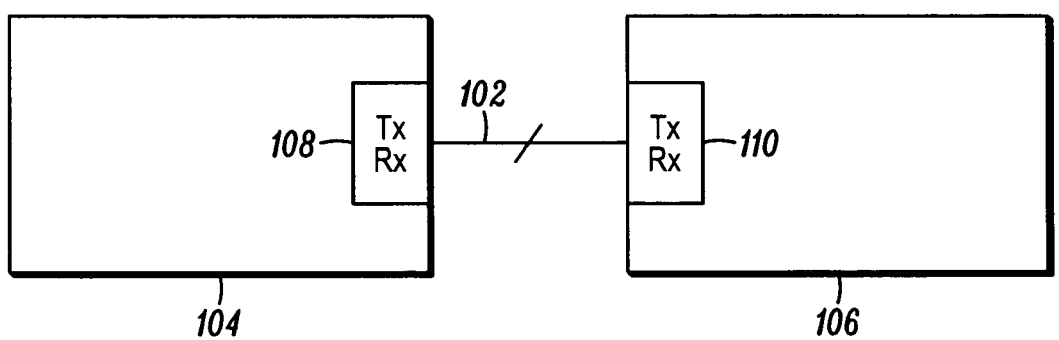
FIG. 1 is a simplified diagram of a serial data communication system, in which phase jitter may be measured.
Figure 2:
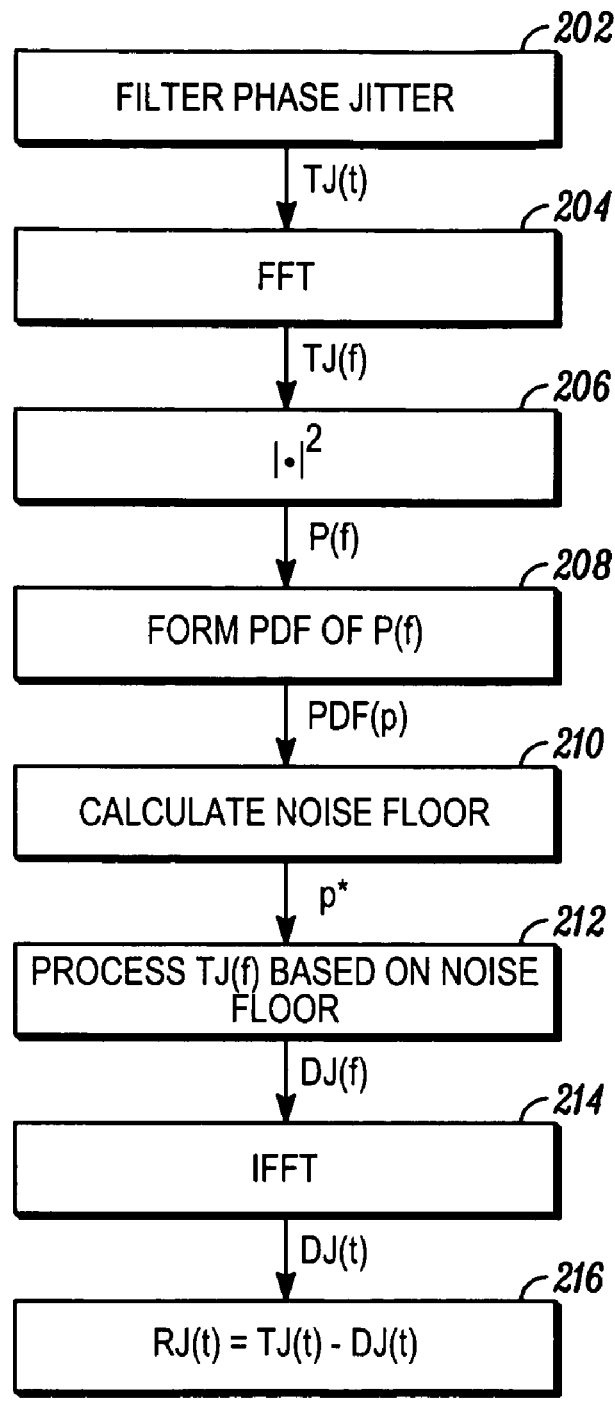
FIG. 2 illustrates a flow diagram according to an embodiment of the present invention.

FIG. 2 illustrates a flow diagram according to an embodiment of the present invention. Various modules in the flow diagram of FIG. 2 may be realized in software, hardware, firmware, or some combination thereof. In FIG. 2 and its accompanying description, TJ(•) represents the total jitter (after high-pass filtering), either in the (discrete) time domain or the (discrete) frequency domain, depending upon its argument. For example, TJ(t) is the total jitter expressed in the time domain, and TJ(f) is the total jitter expressed in the frequency domain.

The deterministic component of the total jitter is represented by DJ(•), where as for the total jitter, the argument in DJ(•) determines whether the deterministic component is expressed in the time domain, or in the frequency domain. The random component of the total jitter is represented by RJ(•), and again, its argument determines whether the random component is expressed in the time domain, or in the frequency domain.

In FIG. 2, it is assumed that a real-time serial bus analyzer has performed raw measurements on a data signal to provide a raw total jitter $TJ_R(t)$ In module 202, the raw total jitter is high-passed filter so as to remove the low-frequency components, thereby providing the high-passed filtered total jitter TJ(t). In module 204, the FFT (Fast Fourier Transform) is applied to the time samples TJ(t) to yield TJ(f). It should be noted that in general, a DFT (Discrete Fourier Transform) is applied, where for some embodiments the DFT may be implemented as an FFT. Furthermore, some embodiments may weight TJ(t) by a time domain window before performing a DFT.

In module 206, the power spectrum P(f) is provided, where $P(f)=|TJ(f)|^2$. In module 208, a density function, denoted as PDF(p), of the power spectrum P(f) is formed. Roughly stated, the density function provides the number of frequency bins in the power spectrum P(f) that fall within some range of power. That is, the product PDF(p)Δp should approximate the number of frequency bins in the power spectrum P(f) having a power within the range [p−Δp/2, p+Δp/2]. The density function PDF(p) is seen to be a histogram, and it is formally similar to a probability density function. This is the reason for denoting the density function as PDF(p), so that "PDF" may serve as a mnemonic for a "probability density function."

The density function PDF(p) may be calculated in various ways. For example, a resolution Δ in power may be chosen, so that PDF(p) is the number of frequency bin indices f* for which $p-\Delta/2 \leq P(f^*) < p+\Delta/2$.

Based upon the density function, a parameter is determined in module 210, where the parameter may be characterized as an estimate of the noise floor of the jitter. For convenience, this parameter will be referred to as the noise floor. The noise floor is that power p* such that $$p^* = \underset{p}{\operatorname{argmax}}\left\{\frac{d^2 PDF}{dp^2}\right\}.$$

That is, the noise floor is that power at which the second derivative of the density function is a maximum. A constraint to the above expression is that the noise floor power p* is such that it is greater than that power where the first derivative of the density function is a minimum. That is, the above expression may be modified to $$p^* = \underset{p}{\operatorname{argmax}}\left\{\frac{d^2 PDF}{dp^2}\right\},$$

such that p>p**,
where $$p^{**} = \underset{p}{\operatorname{argmin}}\left\{\frac{d PDF}{dp}\right\}.$$

In module 212, the total jitter in the frequency domain, TJ(f), is processed using the noise floor to yield an estimate of the deterministic part of the jitter in the frequency domain, denoted as DJ(f). Those components of TJ(f) that are in magnitude less than or equal to the noise floor are zeroed-out, that is, are multiplied by zero. This amounts to filtering the total jitter in the time domain. However, module 212 involves more than filtering. The other components of TJ(f) are also processed, as described below.

Subtracted from each component of TJ(f) having a magnitude greater than the noise floor p* is a complex-valued number, generally different for each frequency bin index f. Each complex-valued number is taken from a pseudo-random sequence. Each complex-valued number in the pseudo-random sequence has a magnitude equal to the noise floor p*, but the phases are uniformly distributed about [0,2π]. The result, after filtering out those components of TJ(f) having a magnitude equal to or less than the noise floor, and after subtracting from the remaining components of TJ(f) the pseudo-random numbers as discussed above, is an estimate of the deterministic part of the phase jitter in the frequency domain, denoted as DJ(f).

The above description for processing TJ(f) to obtain DJ(f) may be expressed as follows. For each frequency f where |TJ(f)|≤p*, set DJ(f)=0. For each frequency f where |TJ(f)|>p*, set DJ(f)=TJ(f)−p*$e^{j\theta(f)}$, where for each such f, θ(f) is a pseudo-random phase (number) uniformly distributed over [0,2π].

In module 214, the inverse discrete Fourier transform of DJ(f) is formed, which for some embodiments may be implemented as an IFFT (Inverse FFT), to yield an estimate of the deterministic part of the jitter in the time domain, denoted as DJ(t). For some embodiments, to force DJ(t) to be real, the real part of the inverse discrete Fourier transform may be taken to provide DJ(t). That is, for example, $$DJ(t)=Re\{IFFT\{DJ(f)\}\}.$$

In module 216, the (estimate of) deterministic jitter is subtracted from the total jitter to yield an estimate of the random part of the jitter, denoted as RJ(t).

The estimate of the deterministic part of the jitter, whether in the frequency domain or in the time domain, is not exactly the deterministic part of the jitter. However, for most common cases, there is a significant amount of deterministic jitter with respect to the random component, such as for example when there are relatively clear spectral tones at frequencies $f_T$, where T denotes an index specifying the clear spectral tones. For such cases, it is expected that |DJ($f_T$)|>>|RJ($f_T$)|. Because a good numerical estimate is available for the total jitter, TJ($f_T$), and because TJ($f_T$)=DJ($f_T$)+RJ($f_T$), it is expected that when |DJ($f_T$)|>>|RJ($f_T$)|, a good approximation of the deterministic jitter DJ($f_T$), and consequently DJ(t), will be provided by the embodiments described herein.

The estimate of the random component of the total jitter, RJ(t), is not the actual random part of the jitter, but may be viewed as an estimated random jitter having spectral characteristics similar to that of the actual random part of the jitter.

The overall result of the flow diagram in FIG. 2 is that the measured jitter is decomposed into a deterministic part and a random part. It is expected that the random part of the decomposition will have a spectral characteristic sufficiently close to the actual random part of the jitter, so that good estimates of the bit error rate may be realized.

Various modifications may be made to the disclosed embodiments without departing from the scope of the invention as claimed below. As discussed earlier, it should be appreciated that the modules illustrated in FIG. 2 may be realized in hardware, software, firmware, or some combination thereof. For example, module 202 may be a software routine to perform filtering on a measured phase jitter, or module 202 may represent a hardware-implemented filter. Similar statements apply to some or all of the modules in FIG. 2. As another example, performing a frequency transformation as indicated in module 204 may be implemented as a Fast Fourier Transform in software running on a programmable processor, or as a special purpose processor or circuit to perform a frequency transformation.

Various mathematical relationships may be used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. For example, some transformations may be carried out in hardware, so that they can at best only be approximately performed. Or, some transformations may be performed in software, so that such transformations can only be carried out with finite numerical precision. As a result, one of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. A method comprising:

filtering a jitter signal $TJ_R(t)$ to provide a filtered jitter signal TJ(t);

transforming the filtered jitter signal into the frequency domain to provide a frequency transformed filtered jitter signal TJ(f);

forming a density function PDF(p) where p is a power, where PDF(p)Δp for a differential power Δp is the number of frequency bins in TJ(f) for which |TJ(f)|$^2$ falls within a range [p−Δp/2, p+Δp/2];

forming a noise floor p* based upon the density function where $$p^* = \underset{p}{\mathrm{argmax}}\left\{\frac{d^2\,PDF(p)}{d\,p^2}\right\},$$

such that p>p, where $$p^{} = \underset{p}{\mathrm{argmin}}\left\{\frac{d\,PDF(p)}{d\,p}\right\};$$

and processing the frequency transformed filtered jitter signal to zero out those frequency components having a magnitude less than or equal to the noise floor, and subtracting from the remaining frequency components a pseudo random sequence having a magnitude equal to the noise floor and having a uniformly distributed phase, to provide a deterministic jitter signal in the frequency domain.

2. The method as set forth in claim 1, further comprising: performing an inverse frequency transform on the frequency domain deterministic jitter signal to provide a deterministic jitter signal in the time domain.

3. The method as set forth in claim 2, further comprising: subtracting the time domain deterministic jitter signal from the filtered jitter signal to provide a pseudo random jitter signal in the time domain.

4. The method as set forth in claim 1, wherein transforming the filtered jitter signal into the frequency domain comprises a Fast Fourier Transform.

5. The method as set forth in claim 4, wherein transforming the filtered jitter signal into the frequency domain comprises applying a window to the filtered jitter signal.

6. An apparatus comprising:
a filter module to filter a measured jitter signal $TJ_R(t)$ to provide a filtered jitter signal $TJ(t)$;
a frequency transformation module to transform the filtered jitter signal into the frequency domain to provide a frequency transformed filtered jitter signal $TJ(f)$;
a module to form a density function $PDF(p)$ where p is a power, where $PDF(p)\Delta p$ for a differential power $\Delta p$ is the number of frequency bins in $TJ(f)$ for which $|TJ(f)|^2$ falls within a range $[p-\Delta p/2, p+\Delta p/2]$;
a module to calculate a noise floor p* based upon the density function where $$p^* = \operatorname*{argmax}_{p}\left\{\frac{d^2 PDF(p)}{d p^2}\right\},$$

such that p>p, where $$p^{} = \operatorname*{argmin}_{p}\left\{\frac{d PDF(p)}{d p}\right\};$$

and
a module to process the frequency transformed filtered jitter signal to zero out those frequency components having a magnitude less than or equal to the noise floor, and to subtract from the remaining frequency components a pseudo random sequence having a magnitude equal to the noise floor and having a uniformly distributed phase, so as to provide a deterministic jitter signal in the frequency domain.

7. The apparatus as set forth in claim 6, wherein the module to form the density function comprises a software module.

8. The apparatus as set forth in claim 7, wherein the module to process the frequency transformed filtered jitter signal comprises a second software module.

9. The apparatus as set forth in claim 6, further comprising:
a serial data link to provide a signal, wherein the measured jitter signal is received on the serial data link.

10. The apparatus as set forth in claim 6, further comprising:
a module to perform an inverse frequency transform on the frequency domain deterministic jitter signal to provide a deterministic jitter signal in the time domain.

11. The apparatus as set forth in claim 10, further comprising:
a module to subtract the time domain deterministic jitter signal from the filtered jitter signal to provide a pseudo random jitter signal in the time domain.

12. An article of manufacture comprising a computer readable medium, the computer readable medium comprising computer instructions to:
filter a jitter signal $TJ_R(t)$ to provide a filtered jitter signal $TJ(t)$;
transform the filtered jitter signal into the frequency domain to provide a frequency transformed filtered jitter signal $TJ(f)$;
form a density function $PDF(p)$ where p is a power, where $PDF(p)\Delta p$ for a differential power $\Delta p$ is the number of frequency bins in $TJ(f)$ for which $|TJ(f)|^2$ falls within a range $[p-\Delta p/2, p+\Delta p/2]$;
form a noise floor p* based upon the density function where $$p^* = \operatorname*{argmax}_{p}\left\{\frac{d^2 PDF(p)}{d p^2}\right\},$$

such that p>p, where $$p^{} = \operatorname*{argmin}_{p}\left\{\frac{d PDF(p)}{d p}\right\};$$

and
process the frequency transformed filtered jitter signal to zero out those frequency components having a magnitude less than or equal to the noise floor, and to subtract from the remaining frequency components a pseudo random sequence having a magnitude equal to the noise floor and having a uniformly distributed phase, to provide a deterministic jitter signal in the frequency domain.

13. The article of manufacture as set forth in claim 12, the computer readable medium further comprising computer instructions to:
perform an inverse frequency transform on the frequency domain deterministic jitter signal to provide a deterministic jitter signal in the time domain.

14. The article of manufacture as set forth in claim 13, the computer readable medium further comprising computer instructions to:
subtract the time domain deterministic jitter signal from the filtered jitter signal to provide a pseudo random jitter signal in the time domain.

* * * * *